United States Patent [19]
Nettelbladt et al.

[11] Patent Number: 5,543,638
[45] Date of Patent: Aug. 6, 1996

[54] SEMICONDUCTOR LIGHT EMITTING DEVICE

[75] Inventors: Hans Nettelbladt, Bromma; Michael Widman, Kungsängen, both of Sweden

[73] Assignee: Asea Brown Boveri AB, Västerås, Sweden

[21] Appl. No.: 274,419

[22] Filed: Jul. 13, 1994

[30] Foreign Application Priority Data

Aug. 20, 1993 [SE] Sweden ................................ 9302691

[51] Int. Cl.⁶ ........................ H01L 33/00; H01L 29/06; H01L 31/0328
[52] U.S. Cl. ........................ 257/98; 257/22; 257/23; 257/95; 257/97; 257/103
[58] Field of Search ............................ 257/95, 96, 97, 257/98, 103, 22, 23; 372/45, 46, 50, 99

[56] References Cited

U.S. PATENT DOCUMENTS

| 5,136,603 | 8/1992 | Hasnain et al. | 372/50 |
| 5,206,872 | 4/1993 | Jewell et al. | 372/46 |
| 5,208,820 | 5/1993 | Kurihara et al. | 372/45 |
| 5,216,685 | 6/1993 | Asada | 372/45 |
| 5,237,581 | 8/1993 | Asada et al. | 372/45 |
| 5,289,018 | 2/1994 | Okuda et al. | 257/98 |
| 5,341,390 | 8/1994 | Yamada et al. | 372/45 |
| 5,351,256 | 9/1994 | Schneider et al. | 372/45 |
| 5,375,133 | 12/1994 | Mori et al. | 372/45 |
| 5,390,210 | 2/1995 | Fouquet et al. | 372/92 |
| 5,404,373 | 4/1995 | Cheng | 372/50 |

*Primary Examiner*—Ngân V. Ngô
*Attorney, Agent, or Firm*—Watson Cole Stevens Davis, P.L.L.C.

[57] ABSTRACT

A semiconductor light-emitting device employs a quantum well having a fundamental wavelength in the absence of an external electric field; a microcavity with two reflectors, having a resonance wavelength which closely corresponds to the fundamental wavelength of the quantum well; and electrodes for applying an electric field across the microcavity to change the wavelength of the quantum well and thereby control the radiance of the microcavity.

10 Claims, 2 Drawing Sheets

SEMICONDUCTOR LIGHT EMITTING DEVICE

TECHNICAL FIELD

The present invention relates to a method and a device for emitting light which can be modulated with very high frequency. The invention which is designed in a semiconductor material has its main field of application within fibre optics.

BACKGROUND ART

There are several different ways of exciting a light-emitting semiconductor such that it emits light. Photoluminescence arises when the excitation takes place by illumination by light of a wavelength shorter than that of the emitted light. During electroluminescence the excitation takes place by injecting current into the semiconductor.

The radiance of a light source is defined as the light flux per m$^2$ and per steradiane (w m$^{-2}$ st$^{-1}$). The radiance of a light-emitting semiconductor is proportional to the number of injected electron-hole pairs, the so-called charge carrier density.

In spite of the fact that the excitation inside the semiconductor is performed effectively, only a small part of the emitted light is released from the semiconductor. The reason for this is, on the one hand, that the semiconductor has a high refractive index and, on the other hand, that the emitted light is isotropic, that is, it is equally distributed in all directions. A high refractive index means that only that light which becomes incident within a narrow cone perpendicular to the surface of the semiconductor is released, whereas the remainder of the light is reflected in the surface of the semiconductor.

A good luminous efficiency in the semiconductor is obtained by giving it a double hetero (DH) structure, which is built up of three layers in which one thin layer of the light-emitting semiconductor, that so-called active layer, is surrounded by two thicker layers, so-called barrier layers, of another semiconductor material with a larger band gap than that of the active layer.

It is previously known that if a DH structure is placed in a microcavity, the emitted light can be directed. A microcavity comprises two mirrors and the resonance wavelength of the microcavity is determined by the distance between the mirrors. This means that when the emitted wavelength is exactly equal to the resonance wavelength of the microcavity, the light will be directed substantially perpendicularly to the surface of the semiconductor and hence be released from the semiconductor. Only a small part of the light is reflected in the surface of the semiconductor. As mirrors in the microcavity, Bragg reflectors can be used, which consist of a large number of layers of semiconductor material with alternately high and low refractive index. The microcavity can be excited by external radiation (photoluminescence) or by current (electroluminescence).

If the light-emitting layer is made sufficiently thin, a quantum well is formed and the emitted wavelength can be influenced by an external electric field, so-called Stark effect.

When the quantum well emits light with the same wavelength as the resonance wavelength of the microcavity, the light is directed and the radiance is increased. When the quantum well emits light, the wavelength of which deviates from the resonance wavelength of the microcavity, the radiance is reduced. In this way, it is possible to modulate the radiance by varying the electric field across the microcavity. The electric field can be modulated with a much higher frequency than that with which the charge carrier density in the semiconductor can be modulated.

If the quantum well is excited by injecting current via two electrodes on different sides of the microcavity, the electric field across the quantum well cannot be varied independently of the current, and the radiance cannot thus be modulated.

In European patent application with publication No. 0 473 983 A2, the above-mentioned problem has been solved by arranging, in addition to the two electrodes on different sides of the microcavity, a common electrode on the layer which contains the quantum well. This means that the quantum well is excited by the current which flows between the first electrode and the common electrode. The electric field across the quantum well is varied with the common electrode and the third electrode. The radiance can thus be modulated.

This way of solving the problem entails several disadvantages. The current must flow through a Bragg reflector, which has a very high resistance because of the many junctions between materials with different band gaps. Arranging the common electrode on the layer which constitutes the quantum well also entails difficulties since this layer is very thin (100 Å).

To obtain the fastest possible modulation, the changeover time must be made as short as possible. The changeover time is proportional to the capacitance in the microcavity, which in turn is proportional to the area of the quantum well. With the above-mentioned solution, the area of the quantum well is determined by the size of the contact to the common electrode. This sets a lower limit to the changeover time.

The above-mentioned disadvantages can be eliminated by exciting the quantum well with light (photoluminescence) instead. When using an external radiation source, problems with poor efficiency instead arise. On the one hand, it is difficult to extract the radiation efficiently from the radiation source, and on the other hand it is difficult to get the radiation into the microcavity. Because of the high refractive index of the semiconductor materials, the efficiency from an external light source is only about 2%.

One object of the invention is to suggest a method and a device for emitting light which effectively uses light to excite a quantum well, which allows the radiance to be modulated with a very high frequency.

SUMMARY OF THE INVENTION, ADVANTAGES

The invention comprises a method for emitting light where the radiance of the light can be controlled by varying an electric field across a light-emitting member. The light-emitting member is excited by light emitted from a light-emitting PN diode, which is arranged in the same semiconductor body as the light-emitting member.

A device for emission of light according to the invention comprises a light-emitting PN diode and a light-emitting member, the radiance of which can be controlled with an electric field. The light-emitting member and the PN diode are arranged in the same semiconductor body in such a way that light from the PN diode excites the light-emitting member so as to emit light.

The light-emitting member comprises a quantum well which can emit light with an optical wavelength, which in the absence of an external electric field has a fundamental wavelength, a microcavity comprising two reflectors surrounding the quantum well and where the microcavity has a resonance wavelength which closely corresponds to the fundamental wavelength of the quantum well, and means for applying an electric field across the microcavity to change the optical wavelength and thereby control the radiance of the microcavity.

The PN diode has at least one electrode which is separated from the electrodes of the light-emitting member. The PN diode and the light-emitting member are electrically separated from each other in such a way that the electric field across the microcavity is completely independent of the current through the PN diode.

When the radiation source and the microcavity are comprised in the same semiconductor body, a high efficiency is obtained for the excited light source. Since the light never needs to leave the semiconductor, the losses due to reflection in the semiconductor surfaces have been eliminated.

Since no current is to pass through the reflectors, they are allowed to be poor conductors.

The area of the quantum well can be small and therefore the capacitance of the microcavity is also small. In this way, the changeover time can be reduced and the modulating frequency becomes great.

DESCRIPTION OF THE PREFERRED EMBODIMENTS

Figure 1:
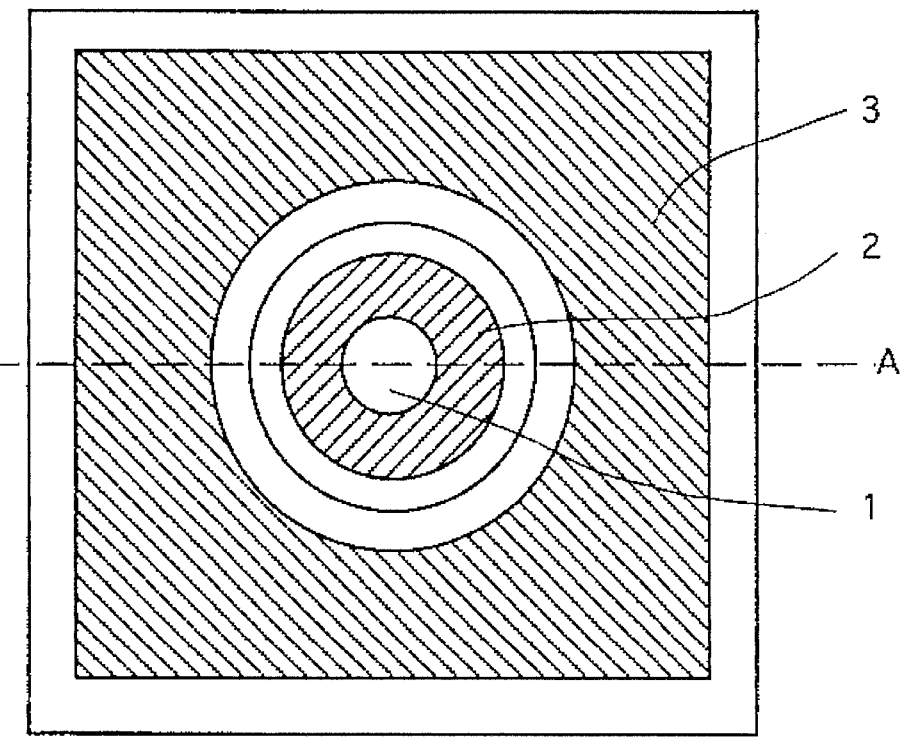
FIG. 1 shows a schematic view of a first embodiment of the invention.
Figure 2:
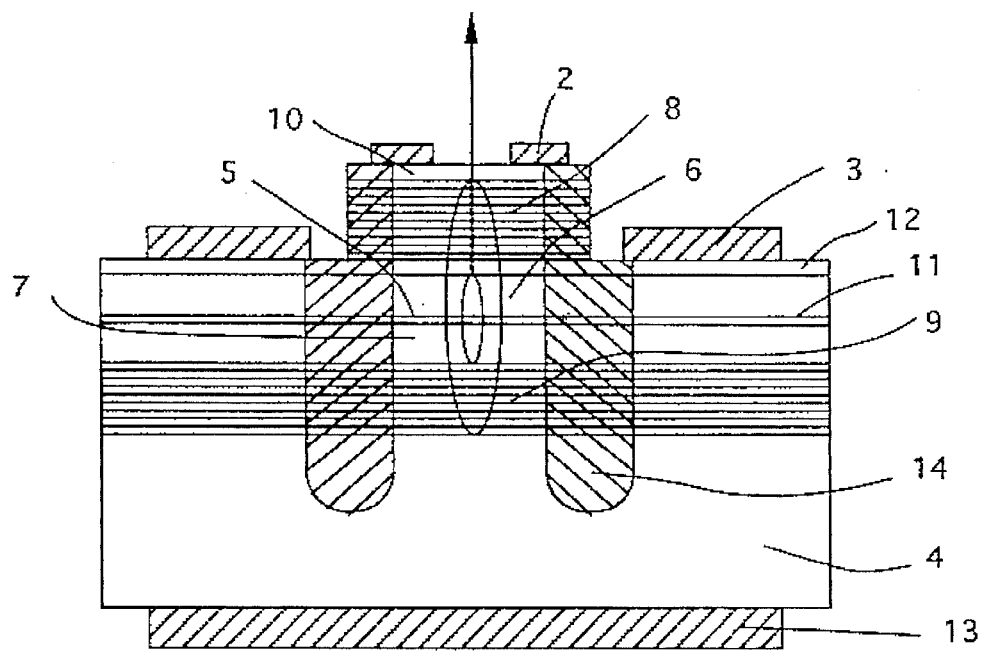
FIG. 2 shows a schematic view of a section A-A through the first embodiment of the invention.

FIGS. 1 and 2 show a first embodiment of the invention. Light is emitted through a window 1, which is surrounded by a circular electrode 2 which belongs to the microcavity, and an electrode 3 which belongs to the PN diode.

The invention is designed on a semiconductor substrate 4, which in this embodiment consists of N-doped GaAs. On the semiconductor substrate there is produced a quantum well which consists of a light-emitting active layer 5 of undoped GaAs and which is located between two barrier layers 6, 7. The barrier layers consist of undoped or weakly N-doped $Al_xGaAs$ with a low content of aluminium (x=0.2).

A microcavity is arranged by placing an upper Bragg reflector 8 and a lower Bragg reflector 9 on separate sides of the barrier layer and the quantum well. The upper Bragg reflector consists of 15 layers which alternately consist of p-conducting AlAs and p-conducting $Al_xGaAs$ with a very low aluminium content (x=0.05). The lower Bragg reflector consists of 30 layers which alternately consist of n-conducting AlAs and n-conducting $Al_xGaAs$ (x=0.05). The first layer, that is, the layer which adjoins the barrier layers, consists of AlAs in both Bragg reflectors. Nearest the surface of the semiconductor body and immediately adjoining the upper Bragg reflector 8, a termination layer 10 of an optically transparent material, for example p-conducting AlGaAs, is suitably arranged.

Figure 3:
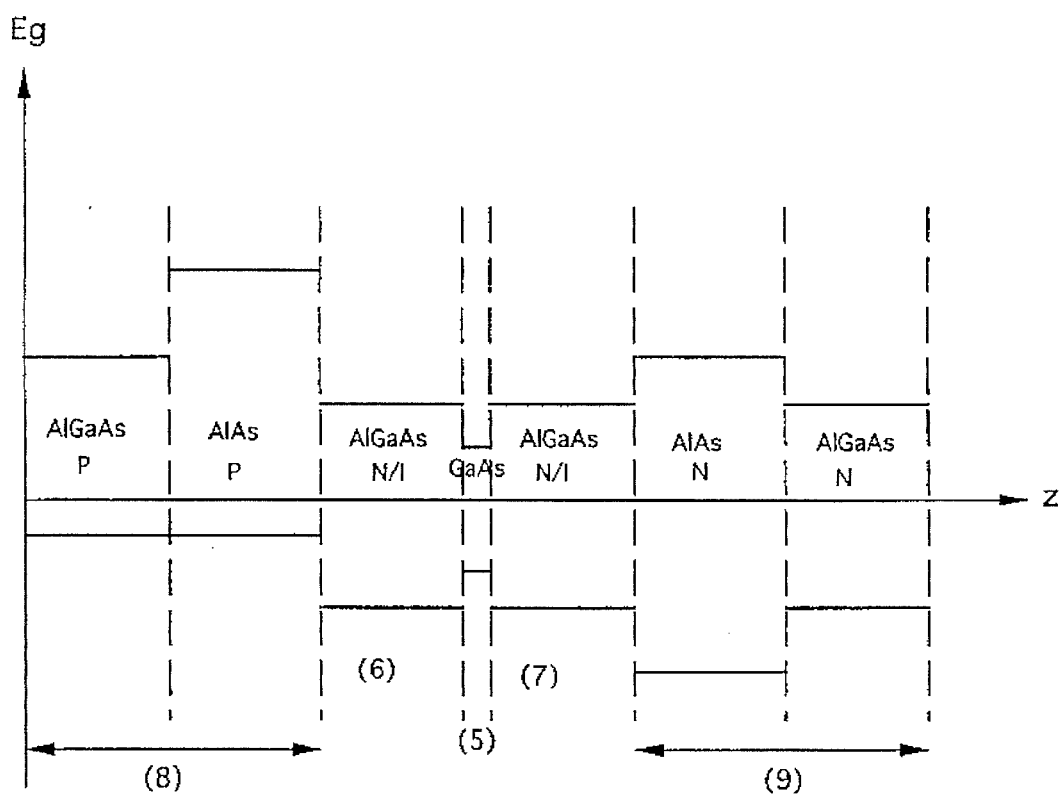
FIG. 3 shows an energy band diagram for the first embodiment of the invention.

An energy band diagram for the first embodiment is illustrated in FIG. 3. The quantum well which consists of GaAs has a smaller band gap than the barrier layers which consist of AlGaAs and the Bragg reflectors which consist of AlAs and AlGaAs.

The fundamental wavelength of the quantum well is determined by the energy band gap of the material and the thickness of the material. The resonance wavelength of the microcavity is determined by twice the distance between the Bragg reflectors and is suitably chosen to be about 1% greater than the fundamental wavelength of the quantum well. The total thickness of the two barrier layers and the active layer shall then be equal to half the resonance wavelength. In this embodiment, the active layer has a thickness of 10 nm, and the barrier layers have a thickness of 112 nm each.

The Bragg reflectors are made from layers, the thickness of which is one-fourth of the resonance wavelength, that is, $\lambda R/4$. The termination layer 10 has an optical thickness= $\lambda R/2$. The optical thickness is the actual thickness multiplied by the refractive index ($OL=L \times n$).

In the same semiconductor substrate a light-emitting PN diode is arranged, which has a light-emitting layer 11. Above the PN diode, part of the upper Bragg reflector has been removed from the surface of the semiconductor body, but at least one of the layers located nearest the barrier layer remains. This layer 12 constitutes the contact layer for the electrode 3 of the PN diode. The microcavity and the PN diode have a common electrode 13. The PN diode is driven continuously by applying current through the electrodes 3 and 13 in the forward direction of the PN diode.

The radiance from the microcavity can be controlled by applying a voltage from an external voltage source between the electrodes 2 and 13 of the microcavity. The radiance emitted from the window 1 is greater when the quantum well emits light with the same wavelength as the resonance wavelength of the microcavity than what it is when the quantum well emits light whose wavelength deviates from the resonance wavelength. It is thus possible to vary the radiance by varying the voltage across the microcavity.

One region 14 between the microcavity and the PN diode has been made electrically insulating by proton bombardment which has penetrated the semiconductor body at least into the lower Bragg reflector 9. This renders the region electrically and optically insulating. After heat treatment, the region 14 changes into being optically transparent again while at the same time the electrical insulation is maintained.

In an alternative embodiment, the insulating region may extend through the whole semiconductor body. Then the electrode 13 can be replaced by two electrodes, one electrode being connected to the microcavity and the other to the PN diode.

In a modification of the first embodiment, the quantum well consists of an undoped InGaAs which is lattice mismatched in relation to GaAs. One advantage of using undoped InGaAs in the quantum well is that it emits light with a wavelength to which the semiconductor substrate GaAs is transparent. This contributes to further reducing the radiation losses from the PN diode. The barrier layers (6,7) consist of undoped or weakly N-doped GaAs. The Bragg reflectors consist of layers which alternately consist of p-conducting AlAs and p-conducting $Al_xGaAs$, where the aluminium content may vary from zero and upwards (x>=0). The layer which adjoins the barrier layer consists of AlAs.

Figure 4:
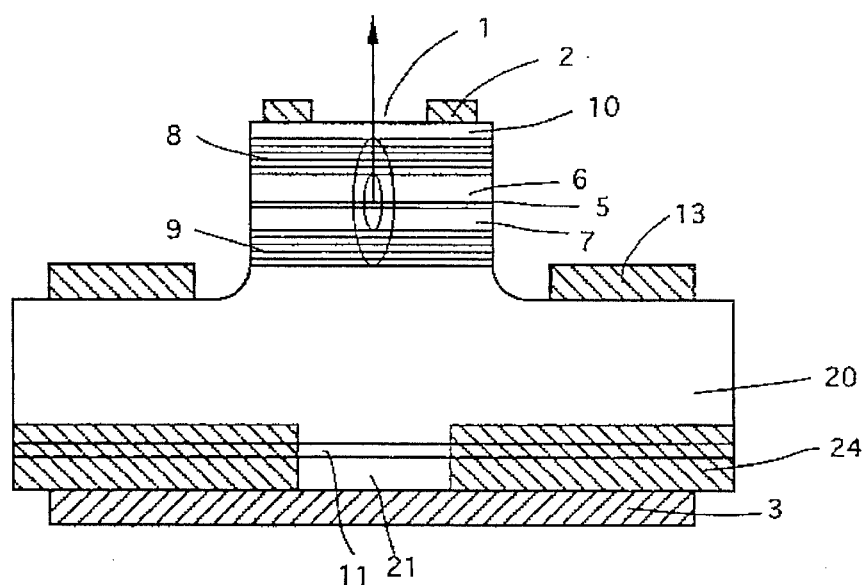
FIG. 4 shows a schematic view of a second embodiment of the invention.

FIG. 4 shows a second embodiment of the invention. This embodiment differs from the first embodiment in that the PN diode is arranged below the microcavity and illuminates the quantum well from below. The PN diode and the quantum well no longer have the same active layer, which provides a possibility of influencing the wavelength of the PN diode by the choice of material in the active layer of the PN diode. The wavelength of the PN diode must, however, be selected so as to belong to a region where the Bragg reflector is optically transparent and shorter than the fundamental wavelength of the quantum well.

In the same way as in the first embodiment, a quantum well 5 of undoped GaAs has been arranged between two barrier layers 6, 7 of undoped AlAs. A microcavity is arranged by placing an upper Bragg reflector 8 and a lower Bragg reflector 9 on different sides of the barrier layers and the quantum well. The Bragg reflectors 8 and 9 consist of layers which alternately consist of AlAs and AlGaAs. The first layer in the Bragg reflectors, that is, the layer which is nearest the barrier layer, consists of AlGaAs. Nearest the surface of the semiconductor body and directly adjoining the upper Bragg reflector 8, a terminating layer 10 of an optical transparent material, for example p-conducting AlGaAs, is suitably arranged.

A PN diode has been arranged such that the microcavity is located between the PN diode and the window 1 from which light is emitted. The active layer 11 of the PN diode consists of AlGaAs and has a larger band gap than the active layer of the quantum well. This means that light from the PN diode can excite the quantum well. The light from the PN diode has a wavelength for which the lower Bragg reflector 9 is transparent. the PN diode has two barrier layers 20, 21 of AlGaAs, where the content of aluminium shall be so high that the barrier layer has a band gap which is larger than the active layer. Both the active layer and the lower barrier layer 21 are p-conducting. The layers 20 between the microcavity and the PN diode consist of n-conducting AlGaAs, whose content of AlAs is greater than 35% and constitutes a common earth.

The microcavity has an electrode 2, and the PN diode has an electrode 3. The microcavity and the PN diode have a common electrode 13. When the electrodes 3 and 13 have been energized, such that forward voltage is applied to the PN diode, the PN diode emits light with a wavelength which is sufficiently short to be able to excite the quantum well. Because of the high refractive index of the semiconductor material, the major part of the light from the PN diode will be maintained in the semiconductor body. This results in effective illumination of the quantum well. The radiance from the microcavity can be controlled by applying a voltage from an external voltage source between the electrodes 2 and 13 of the microcavity. The region 24 has been electrically insulating by proton implantation.

For the thickness of the layers in the Bragg reflectors and the barrier layers in the microcavity, the same applies as in the first embodiment described.

The invention can, of course, also be designed in semiconductor materials other than those described above. The Bragg reflectors may, for example, be of dielectric materials, that is, non-conducting materials, for example silicon dioxide or titanium oxide. One of the reflectors may be of metal.

We claim:

1. A device for emitting light comprising:

a light-emitting member arranged in a semiconductor body, where the radiance of the light-emitting member is controllable by an external electrical field applied thereacross; the light-emitting member including a light-emitting active layer for emitting light, from opposite sides thereof and which, in the absence of an external electric has a fundamental wavelength, and reflectors spaced apart by a selected distance on opposite sides of the active layer forming a microcavity with a resonance wavelength which is determined by the distance between the reflectors; and a light-emitting PN diode arranged in the same semiconductor body as the light-emitting member for producing excitation light when a forward bias is applied thereto in such a way that the excitation light from the PN diode excites the light-emitting member.

2. A device for emitting light according to claim 1 further comprising:

means for achieving a variable electric field across the active layer.

3. A device for emitting light according to claim 2, wherein the light-emitting active layer comprises a quantum well.

4. A device for emitting light according to claim 2, wherein the reflectors comprise Bragg reflectors.

5. A device for emitting light according to claim 2, wherein at least one of the reflectors comprises a dielectric.

6. A device for emitting light according to claim 2, wherein at least one of the reflectors comprises a metal.

7. A device for emitting light according to claim 2, wherein the microcavity has a resonance wavelength which closely corresponds to the fundamental wavelength of the active layer.

8. A device for emitting light according to claim 2, wherein electrodes are arranged to produce the variable electric field.

9. A device for emitting light according to claim 2, wherein the PN diode and the light-emitting member are electrically separated from each other.

10. A device for emitting light according to claim 2, wherein the PN diode and the light-emitting member have a common electrode.

* * * * *